US006295633B1

(12) United States Patent
Murakawa

(10) Patent No.: US 6,295,633 B1
(45) Date of Patent: Sep. 25, 2001

(54) FLOOR-PLANNING TECHNIQUE APPLIED TO CIRCUIT DESIGN IN WHICH A CIRCUIT IS DIVIDED AUTOMATICALLY INTO SUB-CIRCUITS THAT ARE EQUALLY MATCHED WITH EFFICIENTLY ARRANGED PHYSICAL BLOCKS

(75) Inventor: Ikuko Murakawa, Kawasaki (JP)

(73) Assignee: Fujitsu Limited, Kaswasaki (JP)

( * ) Notice: Subject to any disclaimer, the term of this patent is extended or adjusted under 35 U.S.C. 154(b) by 0 days.

(21) Appl. No.: 09/158,077

(22) Filed: Sep. 22, 1998

(30) Foreign Application Priority Data

Apr. 16, 1998 (JP) .................................................. 10-106279

(51) Int. Cl.$^7$ .............................. G06F 17/50; H01L 21/00
(52) U.S. Cl. .................................... 716/8; 430/30; 716/1; 716/2; 716/7; 716/12; 716/19
(58) Field of Search ............................. 29/25.01; 430/30; 716/8, 2, 19, 1, 7, 12

(56) References Cited

FOREIGN PATENT DOCUMENTS

| 5-216962 | 8/1993 | (JP) . |
| 7-85114 | 3/1995 | (JP) . |

Primary Examiner—Matthew Smith
Assistant Examiner—Jibreel Speight
(74) Attorney, Agent, or Firm—Staas & Halsey LLP

(57) ABSTRACT

The invention provides a floor planning technique by which physical blocks having areas sufficiently matching with actual sub circuits can be produced automatically and also a physical block of a shape other than a rectangle can be produced using a very simple technique. To this end, a floor planning apparatus of the invention includes a circuit unit recognition section for recognizing circuit units which compose each of the sub circuits, a part information storage section for storing, for each of the circuit units, numbers of parts of different part types which compose the circuit unit, a part number calculation section for acquiring, for each of the different part types, the numbers of the parts composing the circuit units recognized by the circuit unit recognition section from the part information storage section and calculating, for each of the different part types, total numbers of the parts in each of the sub circuits, and an area calculation section for calculating and determining an area of the physical block based on the total numbers of the parts calculated for each of the different part types by the part number calculation section. The invention can be applied to designing of a circuit such as an LSI (Large Scale Integration) and a PCB (Printed Circuit Board).

17 Claims, 8 Drawing Sheets

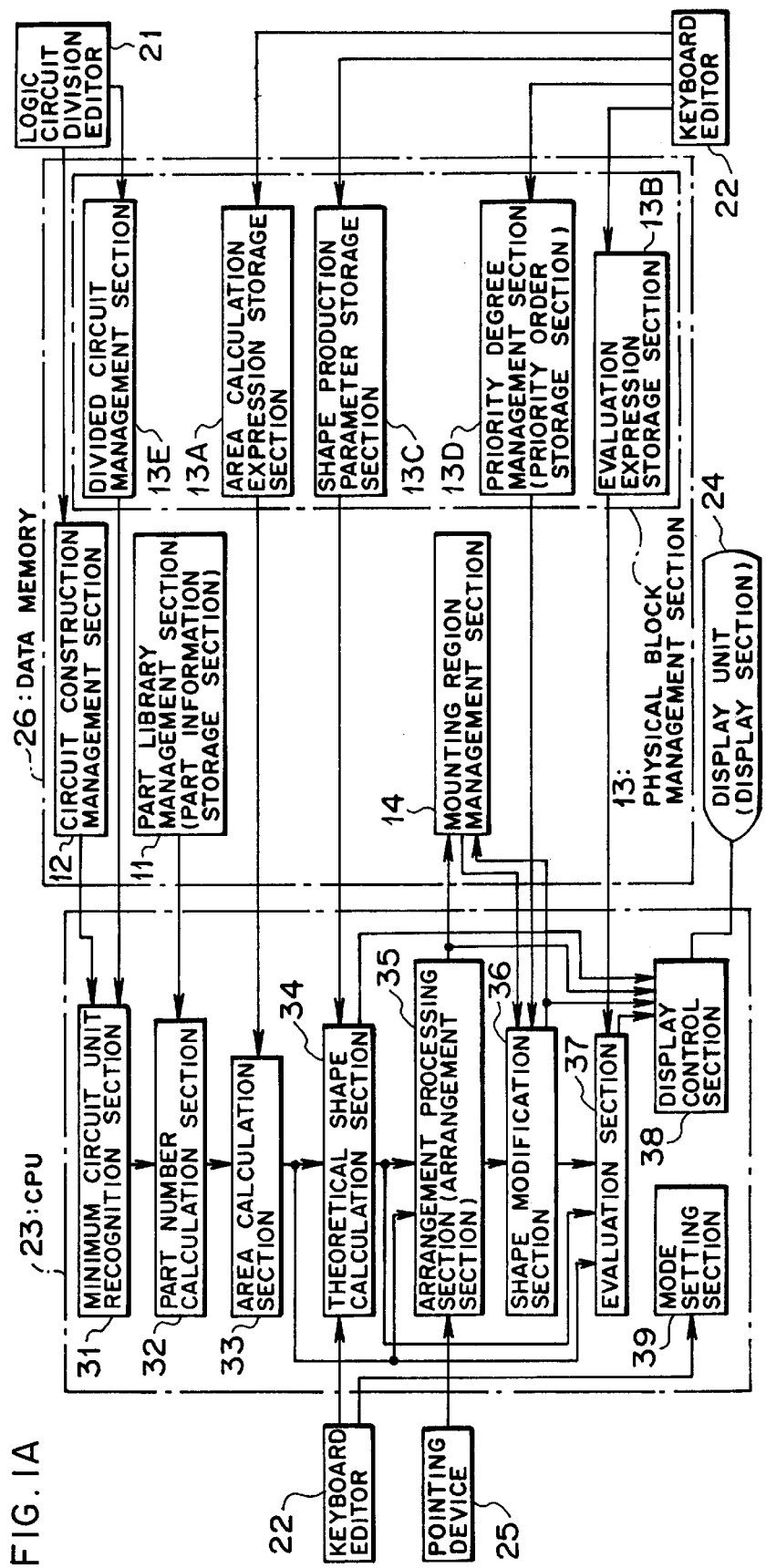
FIG. IA
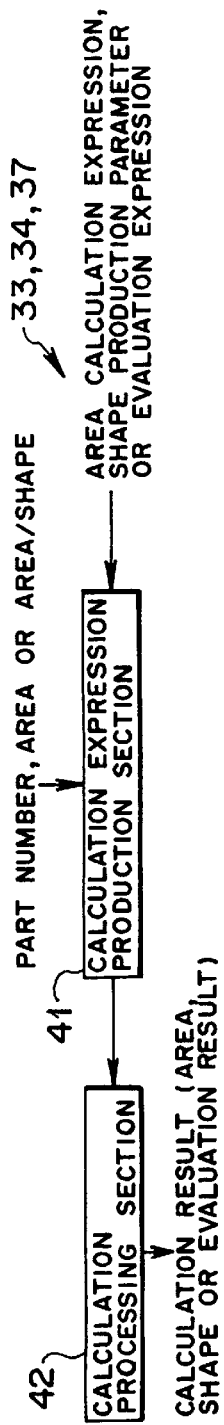
FIG. IB

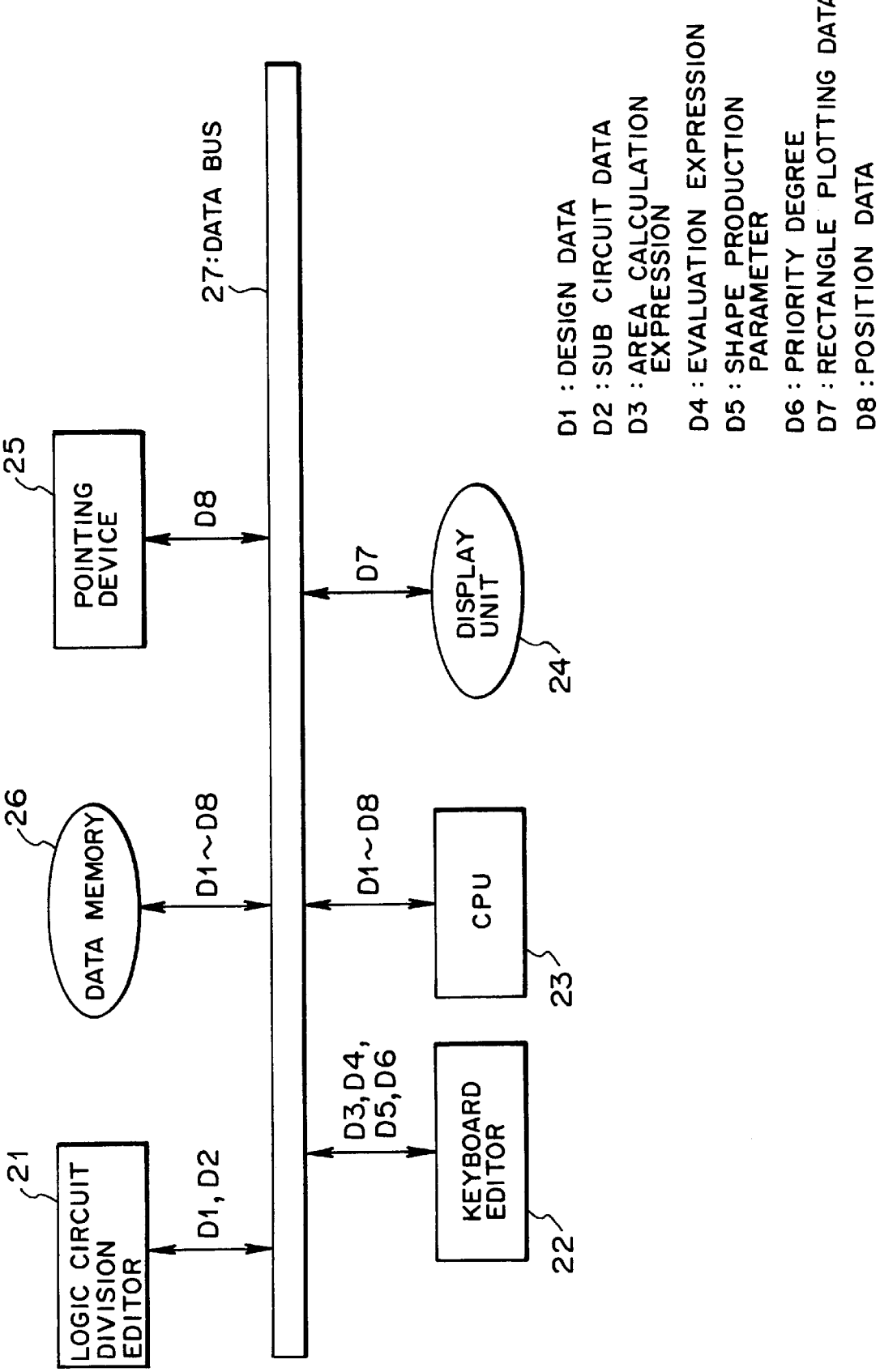

PHYSICAL BLOCKS SET FOR INDIVIDUAL SUB CIRCUITS

MOUNTING REGION

FLOOR-PLANNING TECHNIQUE APPLIED TO CIRCUIT DESIGN IN WHICH A CIRCUIT IS DIVIDED AUTOMATICALLY INTO SUB-CIRCUITS THAT ARE EQUALLY MATCHED WITH EFFICIENTLY ARRANGED PHYSICAL BLOCKS

BACKGROUND OF THE INVENTION

1) Field of the Invention

This invention relates to a technique applied to designing of a circuit such as an LSI (Large Scale Integration) or a PCB (Printed Circuit Board).

It is a common practice to perform, after logical designing, floor planning in order to mount a result of the logical designing. While also it is a common practice to temporarily mount a result of logical designing to verify the same and feed back a result of the verification to the logical designing, also upon such temporary mounting, floor planning is performed.

A result of logical designing of a design object circuit is normally divided into a plurality of circuit parts of sizes which are easy to handle. The circuit parts are called sub circuits (or divided circuits). Then, in the floor planning, physical blocks having areas necessary to mount the sub circuits in a mounting region are determined first, and then the physical blocks determined corresponding to the sub circuits are arranged in the mounting region.

The present invention relates to an apparatus for and a method of executing such floor planning as described above and also to a computer-readable recording medium on which a floor planning program for realizing the apparatus and the method is recorded.

2) Description of the Related Art

Usually, floor planning is performed upon mounting of a circuit after logical designing or upon temporary mounting of a circuit for verifying a result of logical designing.

As described above, a result of logical designing of a design object circuit is normally divided into a plurality of sub circuits (divided circuits) of sizes which are easy to handle. Each sub circuit is composed of a plurality of circuit units (which may be hereinafter referred to as minimum circuit units). Where the design object circuit is an LSI, the minimum circuit unit is a cell.

In an ordinary floor planning apparatus, the shapes of physical blocks onto which sub circuits are to be mounted in a mounting region are limited to rectangles, and the area (size) of each physical block is either designated by an operator (a user or a designer) or automatically produced based on a duty (=circuit area/region area) and an aspect ratio designated by an operator, and the theoretical shape of the physical block is displayed. Here, for the circuit area, a sum total of the areas of a plurality of minimum circuit units (for example, leaf cells) which compose each sub circuit.

Thereafter, in the ordinary floor planning apparatus, the physical blocks (rectangles) whose shapes/areas are set for the individual sub circuits are arranged as they are in the mounting region to determine the arrangement positions of them. In this instance, the physical blocks are usually arranged such that they do not overlap with any other physical block. For example, where ten physical blocks B1 to B10 are set as shown in FIG. 8, they are arranged, for example, in such a manner as shown in FIG. 9 in a mounting region.

However, when the areas of the physical blocks are determined as described above, if an operator designates the areas of the physical blocks one by one for the sub circuits, not only is much time required for the floor planning and a much burden is imposed on the operator, but also the floor planning is inefficient. Thus, it is demanded to automate the determination of the areas of physical blocks.

Further, where the ordinary technique wherein the areas of physical blocks are automatically produced and determined as described above is employed, only the shapes/areas are automatically produced by designating the duties and the aspect ratios determined taking the areas of minimum circuit units into consideration. The area of a physical block should be determined roughly in accordance with a number of parts (for example, basic cells) of minimum circuit units of the physical block. The area, however, is influenced, in the case of an LSI, not only by basic cells, but also by wiring regions of the sub circuit (the number of areas in which the wiring region is included) pins, networks, fan-outs and so forth. Accordingly, the area of a physical block determined based on a duty determined taking only the areas of basic cells of leaf cells (minimum circuit units) into consideration is not considered to sufficiently match an actual sub circuit, but matters in regard to the accuracy and may possibly give rise to some trouble when mounting designing is performed so as to arrange circuit parts in a high density.

Further, since physical blocks are usually limited to rectangles and arranged such that they do not overlap with any other physical block as described above, if physical blocks B1 to B10 of various shapes/areas are arranged as seen in FIG. 9, then it is impossible to fully fill up gaps (refer to slanting line regions in FIG. 9) among the physical blocks B1 to B10, and it cannot be avoided that a plurality of non-used regions appear in the mounting region, which makes it difficult to efficiently use the mounting region. The presence of such non-used regions increases the distances between the physical blocks and consequently increases the lengths of wiring lines between the physical blocks, and this has an influence upon delays of signals and besides gives rise to such a subject that it disturbs high density integration of circuits. Further, the non-used regions appear in most cases as elongated rectangles, and physical blocks which can be arranged in the non-used regions are limited very much in terms of the size and the shape. Consequently, even if it is tried to arrange physical blocks in the non-used regions, those physical blocks which can be arranged are limited.

It seems possible to use, without limiting the shapes of physical blocks to rectangles, various shapes (polygons). In this instance, such subjects as described above are not invited. However, in order to designate a shape other than a rectangle, it becomes necessary to support plotting of a polygon, and this makes operation by an operator very complicated.

For example, if it is tried to set the shape of a physical block to a shape other than a rectangle, then an operator must perform such operation as to first perform an operation for plotting a polygon and then perform, since a duty is fed back as a result of the operation, re-plotting taking the duty into consideration.

Accordingly, from the reason that, upon production of a shape of a physical block from the area of the physical block, the shape can be determined very simply, the shapes to be produced by an ordinary floor planning apparatus are in most cases limited to rectangles.

However, in order to eliminate the problem of signal delays with certainty while an increase in density of circuitry in recent years is satisfied, it is intensely demanded to make it possible to produce a physical block of a shape other than a rectangle using a very simple technique.

SUMMARY OF THE INVENTION

It is an object of the present invention to provide a floor planning apparatus and a floor planning method as well as a computer-readable recording medium having a floor planning program recorded thereon by which physical blocks having areas sufficiently matching with actual sub circuits can be produced automatically and also a physical block of a shape other than a rectangle can be produced using a very simple technique to allow physical blocks to be arranged efficiently in a mounting region and eliminate the problem of signal delays with certainty while satisfying an increase in density of circuitry.

In order to attain the objects described above, according to an aspect of the present invention, there is provided a floor planning apparatus which determines, in order to mount a design object circuit, for each of sub circuits obtained by dividing the design object circuit, a physical block having an area necessary to mount the sub circuit in a mounting region and arranges the physical blocks in the mounting region, comprising a circuit unit recognition section for recognizing circuit units which compose each of the sub circuits, a part information storage section for storing, for each of the circuit units, numbers of parts of different part types which compose the circuit unit, a part number calculation section for acquiring, for each of the different part types, the numbers of the parts composing the circuit units recognized by the circuit unit recognition section from the part information storage section and calculating, for each of the different part types, total numbers of the parts in each of the sub circuits, an area calculation section for calculating and determining an area of the physical block based on the total numbers of the parts calculated for each of the different part types by the part number calculation section, a theoretical shape calculation section for calculating a theoretical shape of the physical block based on the area of the physical block determined by the area calculation section and a shape production parameter set in advance for the physical block, a display control section for causing a display section to display the physical block having the theoretical shape obtained by the theoretical shape calculation section, an arrangement section for arranging the physical block having the theoretical shape obtained by the theoretical shape calculation section at a designated position in the mounting region, and a shape modification section for deleting, when the physical block arranged by the arrangement section overlaps with another one of the physical blocks arranged already, an overlapping portion from one of the arranged physical block and the already arranged physical block and modifying the shape of the one physical block whose overlapping portion is deleted so that the one physical block may have an area equal to the area determined by the area calculation section and may not overlap with the other one of the two physical blocks from which the overlapping portion is not deleted.

The floor planning apparatus may be constructed such that it further comprises a priority order storage section for storing a priority order set in advance for the individual physical blocks, wherein the shape modification section determines one of the physical blocks from which the overlapping portion is to be deleted to modify the shape of the physical block based on the priority order stored in the priority order storage section.

Alternatively, the floor planning apparatus may further comprise a mode setting section for setting a mode in which modification to the shape of any already arranged physical block by the shape modification section is inhibited, or the theoretical shapes of the physical blocks calculated by the shape modification section may be limited to rectangles.

As a further alternative, the floor planning apparatus may be constructed such that it further comprises an area calculation expression storage section for storing an area calculation expression to be used for calculation of the areas of the physical blocks, and the area calculation section re-calculates, upon division modification or logical modification of the design object circuit, the areas of the physical blocks using the area calculation expression stored in the area calculation expression storage section.

Otherwise, the floor planning apparatus may further comprise an evaluation expression storage section for storing an evaluation expression to be used for evaluation of the areas/shapes of the physical blocks, an evaluation section for evaluating the areas/shapes of the physical blocks based on the evaluation expression stored in the evaluation expression storage section, and a display control section for causing the display section to display a result of the evaluation by the evaluation section.

According to another aspect of the present invention, there is provided a floor planning method for determining, in order to mount a design object circuit, for each of sub circuits obtained by dividing the design object circuit, a physical block having an area necessary to mount the sub circuit in a mounting region and arranging the physical blocks in the mounting region, comprising the steps of recognizing, for each of the sub circuits, circuit units which compose the sub circuit, acquiring, for each of the circuit units recognized, numbers of parts of different part types which compose the circuit unit and calculating, for each of the different part types, total numbers of the parts in each of the sub circuits, calculating and determining an area of the physical block based on the total numbers of the parts calculated for each of the different part types, calculating a theoretical shape of the physical block based on the area of the physical block and a shape production parameter set in advance for the physical block, causing a display section to display the physical block having the calculated theoretical shape, and deleting, when the physical block having the calculated theoretical shape is arranged at a designated position in the mounting region, if the physical block overlaps with another one of the physical blocks arranged already, an overlapping portion from one of the newly arranged physical block and the already arranged physical block and modifying the shape of the one physical block whose overlapping portion is deleted so that the one physical block may have an area equal to a determined area and may not overlap with the other one of the two physical blocks from which the overlapping portion is not deleted. In this instance, one of the physical blocks from which the overlapping portion is to be deleted to modify the shape of the physical block may be determined based on a priority order set in advance for the individual physical blocks.

According to a further aspect of the present invention, there is provided a computer-readable recording medium having a floor planning program recorded thereon for causing, in order to mount a design object circuit, a computer to determine, for each of sub circuits obtained by dividing the design object circuit, a physical block having an area necessary to mount the sub circuit in a mounting region and arrange the physical blocks in the mounting region, the floor planning program causing the computer to function as a circuit unit recognition section for recognizing circuit units which compose each of the sub circuits, a part number calculation section for acquiring, for each of the different part types, numbers of parts composing the circuit units recognized by the circuit unit recognition section and calculating, for each of the different part types, total numbers of the parts in each of the sub circuits, an area calculation section for calculating and determining an area of the physical block based on the total numbers of the parts calculated for each of the different part types by the part number calculation section, a theoretical shape calculation section for calculating a theoretical shape of the physical block based on the area of the physical block determined by the area calculation section and a shape production parameter set in advance for the physical block, a display control section for causing a display section to display the physical block having the theoretical shape obtained by the theoretical shape calculation section, an arrangement section for arranging the physical block having the theoretical shape obtained by the theoretical shape calculation section at a designated position in the mounting region, and a shape modification section for deleting, when the physical block arranged by the arrangement section overlaps with another one of the physical blocks arranged already, an overlapping portion from one of the newly arranged physical block and the already arranged physical block and modifying the shape of the one physical block whose overlapping portion is deleted so that the one physical block may have an area equal to the area determined by the area calculation section and may not overlap with the other one of the two physical blocks from which the overlapping portion is not deleted. In this instance, when the floor planning program causes the computer to function as the shape modification section, the floor planning programs may cause the computer to determine one of the physical blocks from which the overlapping portion is to be deleted to modify the shape of the physical block based on a priority order set in advance for the individual physical blocks.

With the floor planning apparatus and the floor planning method as well as the computer-readable recording medium having a floor planning program recorded thereon according to the present invention described above, the following advantages can be anticipated.

(1) For example, where the design object circuit is an LSI, the area of a physical block can be determined automatically taking not only basic cells but also wiring line regions, pins, networks, fan-outs and so forth into consideration as parts which form circuit units. In short, a physical block having an area matching sufficiently with an actual sub circuit can be produced automatically, and upon mounting designing, circuit parts can be arranged in a high density without giving rise to a problem in terms of the accuracy.

(2) Since a theoretical shape of a physical block is calculated automatically based on the area of the physical block determined automatically and a shape production parameter set in advance for the physical block and a result of the calculation is displayed on the display section, the operator who refers to the display section can confirm the physical block having the area and the theoretical shape determined automatically.

(3) When a physical block is arranged at a designated position in a mounting region, if it overlaps with another physical block arranged already, then the overlapping portion is deleted from either one of the newly arranged physical block and the already arranged physical block, and the shape of the physical block from which the overlapping portion is deleted is modified to secure a predetermined area. Consequently, also a physical block of a shape other than a rectangle can be produced automatically. Accordingly, while the shape of each physical block is handled as a rectangle at all in operation, a shape other than a rectangle can be provided as an actual shape to the physical block. Accordingly, physical blocks can be arranged very efficiently in the mounting region, and also the problem of signal delays can be eliminated with certainty while satisfying high density arrangement of circuits.

(4) Where the mode in which shape modification to a physical block arranged already is inhibited can be set, execution of useless calculation upon determination of a shape during editing can be inhibited.

(5) Since the theoretical shapes of the physical blocks are limited to rectangles, calculation and determination of theoretical shapes of the physical blocks can be performed very readily, and the time required for calculation can be reduced remarkably.

(6) Upon division modification or logical modification to a design object circuit, by re-calculating the area of a physical block using the area calculation expression stored in the area calculation expression storage section, the area of a physical block upon division modification or logical modification can be re-determined.

(7) Since an area and a shape of a physical block calculated automatically are automatically evaluated based on the predetermined valuation expression and a result of the evaluation is displayed on the display section, the operator who refers to the display section can confirm the evaluation result of the area and the shape of the physical block and determine readily whether or not processing (changing of the division condition or the like) corresponding to the evaluation result should be performed.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIGS. 1A and 1B show a floor planning apparatus according to an embodiment of the present invention, and wherein FIG. 1A is a block diagram showing a functional construction of the floor planning apparatus and FIG. 1B is a block diagram showing a construction of several components (an area calculation section, a theoretical shape calculation section and an evaluation section) of the floor planning apparatus;

FIG. 2 is a block diagram showing a hardware construction of the floor planning apparatus of FIG. 1A;

DESCRIPTION OF THE PREFERRED EMBODIMENT

Figure 3:
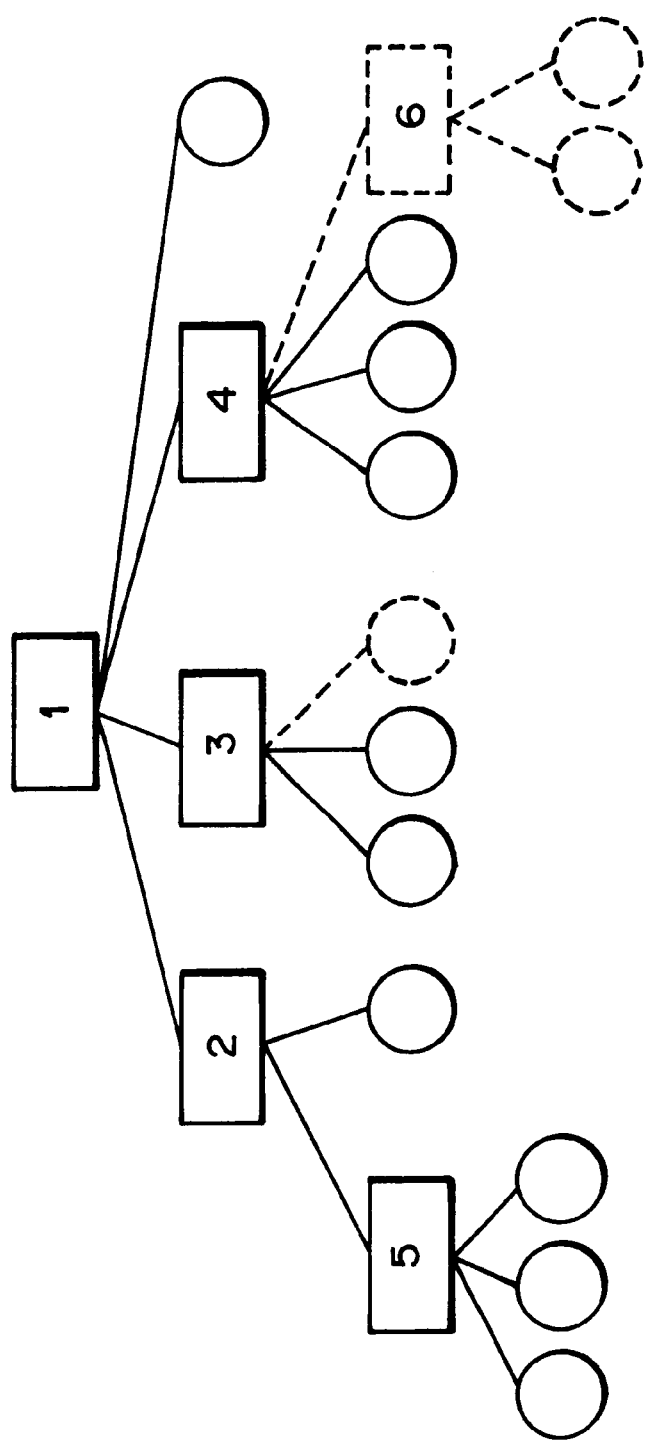
FIG. 3 is a diagrammatic view showing a circuit construction of an LSI of a floor planning object of the floor planning apparatus of FIG. 1A.

A floor planning apparatus to which the present invention is applied is generally constructed such that, in order to mount a design object circuit (in the embodiment of the present invention described below, an LSI), it first determines, for each of sub circuits obtained by dividing the design object circuit, a physical block having an area/shape necessary to mount the sub circuit in a mounting region and then arranges such physical blocks in the mounting region. To this end, the floor planning apparatus is formed from an ordinary processing apparatus (processor or computer) having an arithmetic processing section such as a CPU and storage sections such as a RAM and a ROM.

First, a hardware construction of the floor planning apparatus of the embodiment of the present invention is described with reference to FIG. 2.

As seen from FIG. 2, the floor planning apparatus of the present embodiment includes a logic circuit division editor 21, a keyboard editor 22, a CPU 23, a display unit (display section) 24, a pointing device 25, a data memory 26 and a data bus 27.

The logic circuit division editor 21 divides a logic circuit of an LSI which is a design object circuit into a plurality of sub circuits (which may be hereinafter referred to as divided circuits). The dividing technique will be hereinafter described with reference to FIGS. 3 and 4. A result of the division by the logic circuit division editor 21 is outputted as design data D1 and sub circuit data D2 and managed by the data memory 26 as hereinafter described.

The keyboard editor 22 fetches information (an area calculation expression D3, an evaluation expression D4, shape production parameters D5 and a priority degree D6) from a keyboard not shown operated by an operator.

The CPU 23 performs various functions in order to realize floor planning by the floor planning apparatus of the present invention as hereinafter described with reference to FIG. 1.

The display unit (display section) 24 displays a construction of a design object circuit (LSI) to be divided by the logic circuit division editor 21 and displays a result of processing by the CPU 23 [an area and/or a shape of a physical block (rectangle plotting data D7), an evaluation result and so forth].

The pointing device 25 is, for example, a mouse and is operated by an operator who refers to the display unit 24 to designate and input a predetermined position (refer to, for example, a position P1 of FIG. 7A) in a mounting region as an arrangement position of a physical block (position data D8).

The data memory 26 stores and manages data necessary to execute floor planning by the floor planning apparatus of the present embodiment, that is, design data D1, sub circuit data D2, an area calculation expression D3, an evaluation expression D4, shape production parameters D5, a priority degree D6, rectangle plotting data D7 and position data D8, and has such a functional structure as hereinafter described with reference to FIG. 1.

The data bus 27 interconnects the logic circuit division editor 21, keyboard editor 22, CPU 23, display unit 24, pointing device 25 and data memory 26 described hereinabove to transmit the data D1 to D8 among them.

FIGS. 1A and 1B show the floor planning apparatus as the embodiment of the present invention, and FIG. 1A shows a functional construction of the floor planning apparatus while FIG. 1B shows a construction of several components (the area calculation section, theoretical shape calculation section and evaluation section) of the floor planning apparatus.

Referring first to FIG. 1A, the data memory 26 of the floor planning apparatus of the present embodiment includes a part library management section 11, a circuit construction management section 12, a physical block management section 13 and a mounting region management section 14.

The part library management section (part information storage section) 11 stores, for each of minimum circuit units (leaf cells or circuit units) which form each of sub circuits obtained by dividing a design object circuit, the number of principal parts (for example, basic cells, areas relating to wiring line regions, pins, networks and fan-outs) which compose the minimum circuit unit.

The circuit construction management section 12 manages groups formed from minimum circuit units using logical hierarchies or the like in order to manage sub circuits (divided circuits) corresponding to physical circuits, and cooperates with a divided circuit management section 13E which will be hereinafter described.

The physical block management section 13 manages information necessary to determine and/or modify the area/shape of a physical block and includes an area calculation expression storage section 13A, an evaluation expression storage section 13B, a shape production parameter storage section 13C, a priority degree management section 13D and a divided circuit management section 13E.

The area calculation expression storage section 13A stores area calculation expressions (or procedures) to be used for calculation of necessary areas for physical blocks. The evaluation expression storage section 13B stores evaluation expressions for evaluating the areas and shapes of the physical blocks thus calculated and determined. The area calculation expressions and evaluation expressions to be stored into the storage sections section 13A and 13B are inputted and set through the keyboard editor 22.

The shape production parameter storage section 13C stores shape production parameters set in advance for individual physical blocks. Such shape production parameters are required for a theoretical shape calculation section 34, which will be hereinafter described, to calculate theoretical shapes (rectangles) of physical blocks and inputted and set through the keyboard editor 22. The shape production parameters to be set may be ① aspect ratios of rectangles which compose physical blocks, ② actual dimensions of horizontal or vertical sides of the rectangles which compose the physical blocks, and so forth.

The priority degree management section (priority order storage section) 13D stores priority degrees (priority order numbers) set in advance for individual physical blocks. Also the priority degrees are inputted and set through the keyboard editor 22.

The divided circuit management section 13E manages sub circuits (divided circuits) corresponding to physical blocks and stores relationships between groups managed by the circuit construction management section 12 described above and physical blocks as rules of default interpretation. While the default interpretation of the divided circuit management section 13E is hereinafter described with reference to FIG. 4, use of the default interpretation makes it possible to reserve a relationship between a minimum unit circuit newly added by logical modification and a physical block and makes it possible to re-determine the numbers of parts of individual physical blocks (sub circuits) without intervention of an operator.

The mounting region management section 14 manages an arrangement condition of physical blocks in a mounting region and stores a result of arrangement of a physical block by an arrangement processing section 35 (which will be hereinafter described) and a result of modification of the shape of a physical block by a shape modification section 36 (which will be hereinafter described).

Meanwhile, the CPU 23 of the floor planning apparatus of the present embodiment functions as a minimum circuit unit recognition section 31, a part number calculation section 32, an area calculation section 33, a theoretical shape calculation section 34, an section arrangement processing section 35, a shape modification section 36, an evaluation section 37, a display control section 38 and a mode setting section 39. It is to be noted that the functions mentioned are actually realized as operation of the CPU 23 (computer) as a floor planning program which has been installed from a recording medium such as a hard disk, a magnetic tape, a floppy disk, an optical disk, a magneto-optical disk or a CD-ROM into the computer or the like which forms the floor planning apparatus of the present embodiment is read into the RAM or the like and executed by the CPU 23.

The minimum circuit unit recognition section (circuit unit recognition section) 31 recognizes minimum circuit units (leaf cells or circuit units) which compose each of sub circuits based on information stored in the circuit construction management section 12 and the divided circuit management section 13E (division information by the logic circuit division editor 21).

The part number calculation section 32 acquires the numbers of various parts (for example, basic cells, areas including wiring line regions, pins, networks and fan-outs) which compose a minimum circuit unit recognized by the minimum circuit unit recognition section 31 from the part library management section 11 and calculates, for each of part types, total numbers of parts in individual sub circuits.

The area calculation section 33 substitutes the total number of parts calculated for each part type by the part number calculation section 32 into an area calculation expression read out from the area calculation expression storage section 13A to calculate and determine the area of each physical block. Actually, the area calculation section 33 is composed of a calculation expression production section 41 (which will be hereinafter described) and a calculation processing section 42 (which will be hereinafter described) as shown in FIG. 1B. The area calculation section 33 is constructed such that it re-calculates the area of each physical block using an area calculation expression stored in the area calculation expression storage section 13A upon division change or logical modification of a design object circuit (LSI). It is to be noted that the area calculation expression has a total number of parts of each part type as a variable as hereinafter described.

The theoretical shape calculation section 34 calculates a theoretical shape of a physical block based on the area of the physical block determined by the area calculation section 33 and a shape production parameter set in advance for the physical block. In this instance, the shape production parameter is read out from the shape production parameter storage section 13C. It is to be noted that, in the present embodiment, the theoretical shape of a physical block calculated by the theoretical shape calculation section 34 is limited to a rectangle.

The arrangement processing section (arrangement section) 35 performs processing of arranging a physical block at a predetermined position (refer to, for example, the position P1 of FIG. 7A) in a mounting region designated and inputted through the pointing device 25. The physical block has an area determined by the area calculation section 33 and has a theoretical shape (rectangle) calculated by the theoretical shape calculation section 34. A result of the arrangement by the arrangement processing section 35 is stored into the mounting region management section 14.

The shape modification section 36 refers to information managed by the mounting region management section 14 and reads out, if a physical block arranged by the arrangement processing section 35 overlaps with any other physical block arranged already, priority degrees of the physical block arranged now and the physical block arranged already from the priority degree management section 13D, deletes the overlapping portion from the physical block which has a lower priority degree and automatically modifies the shape of the physical block having the lower priority degree so that the area of the physical block may be equal to the area determined by the area calculation section 33 and the physical block may not overlap with the other physical block having the higher priority degree. A result of the modification by the shape modification section 36 is stored into the mounting region management section 14.

The evaluation section 37 substitutes an area determined by the area calculation section 33 and a value of a shape (horizontal or vertical dimension of a rectangle) calculated by the theoretical shape calculation section 34 or a result of modification by the shape modification section 36 into an evaluation expression read out from the evaluation expression storage section 13B to evaluate the area and/or the shape of each physical block. Actually, the evaluation section 37 is composed of, as seen from FIG. 1B, a calculation expression production section 41 (which will be hereinafter described) and a calculation processing section 42 (which will be hereinafter described). It is to be noted that the evaluation expression has, as variables, an area determined by the area calculation section 33 and a value of a shape (horizontal or vertical dimension of a rectangle) calculated by the theoretical shape calculation section 34 or a result of modification by the shape modification section 36.

The display control section 38 controls the displaying condition of the display unit 24 in order to display the theoretical shape of a physical block obtained by the theoretical shape calculation section 34, a result of modification by the shape modification section 36 or a result of evaluation by the evaluation section 37 on the display unit 24.

The mode setting section 39 sets, in response to an instruction inputted through the keyboard editor 22 by an operator, whether or not a result of shape modification/evaluation of an already arranged physical block by the evaluation section 37 should be displayed. In particular, the mode setting section 39 is operable to selectively set, when a physical block having a high priority degree is arranged by the arrangement processing section 35 and it is discriminated that the physical block overlaps with another already arranged physical block, a mode (adjustment mode) in which a shape modification of the already arranged physical block and a result of evaluation after such shape modification are displayed and another mode (inhibition mode) in which display of such shape modification and evaluation result is inhibited.

It is to be noted that the area calculation section 33, theoretical shape calculation section 34 and evaluation section 37 described above are actually formed as a common section having such a circuit construction as shown in FIG. 1B. In particular, the CPU 23 has a calculation expression production section 41 and a calculation processing section 42 in order to realize the functions of the area calculation section 33, theoretical shape calculation section 34 and evaluation section 37.

When the calculation expression production section 41 and the calculation processing section 42 function as the area calculation section 33, the calculation expression production section 41 produces an expression which replaces a variable of an area calculation expression (an expression which can describe a variable which represents a number of principal parts) read out from the area calculation expression storage section 13A with an actual number of parts from the part number calculation section 32, and the calculation processing section 42 determines a result of calculation of the expression produced by the calculation expression production section 41. Due to the construction described above, when logical modification or division modification is performed, an area re-calculation request for a physical block can be automatically issued in the floor planning apparatus to re-circuit the area for each physical block.

On the other hand, when the calculation expression production section 41 and the calculation processing section 42 function as the theoretical shape calculation section 34, the calculation expression production section 41 produces an expression for determining the lengths of the horizontal and vertical sides of a rectangle based on a shape production parameter read out from the shape production parameter storage section 13C and an area determined by the area calculation section 33, and the calculation processing section 42 determines a result of calculation of the expression produced by the calculation expression production section 41.

Further, when the calculation expression production section 41 and the calculation processing section 42 function as the evaluation section 37, the calculation expression production section 41 produces an expression which replaces a variable of an evaluation expression read out from the area calculation expression storage section 13A with an area determined by the area calculation section 33, a value of a shape (a horizontal or vertical dimension of a rectangle) calculated by the theoretical shape calculation section 34 or a result of modification by the shape modification section 36, and the calculation processing section 42 determines a result of calculation of the expression produced by the calculation expression production section 41.

Now, operation of the floor planning apparatus having such a construction as described above is described with reference to FIGS. 3 to 7.

Figure 4:
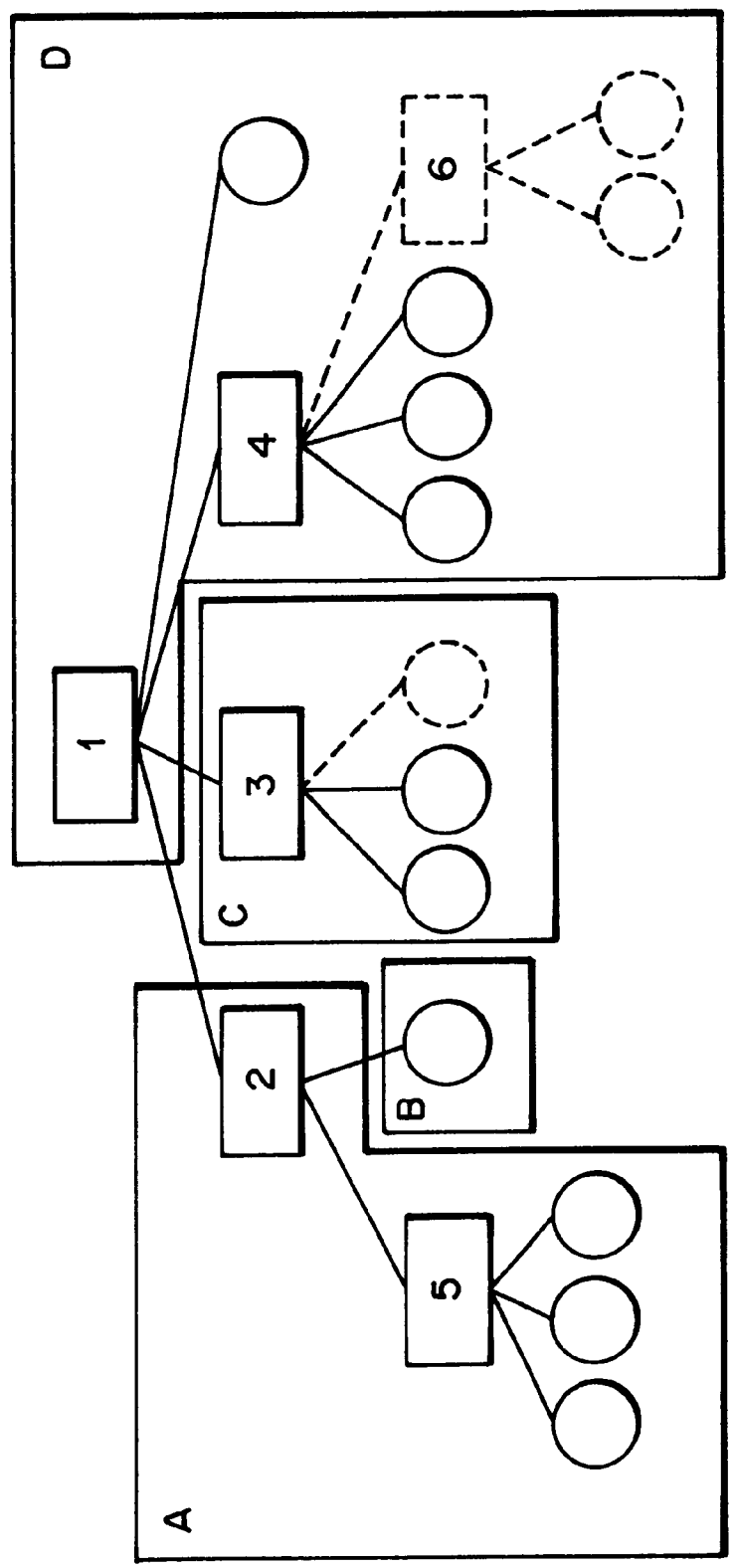
FIG. 4 is a diagrammatic view showing an example of a construction of sub circuits (divided circuits) obtained by dividing the circuit construction of the LSI shown in FIG. 3.

Here, FIG. 3 shows a circuit construction of an LSI of an object of floor planning (design object circuit) of the floor planning apparatus of the present invention, and FIG. 4 shows an example of a construction of sub circuits (divided circuits) obtained by dividing the circuit construction of the LSI shown in FIG. 3 by means of the logic circuit division editor 21.

An LSI of an object of floor planning having, for example, such a construction as shown in FIG. 3 is normally designed in a hierarchical form. In FIGS. 3 and 4, each rectangular block denotes a logical hierarchy (reference numerals 1 to 6); each circle denotes a leaf cell which is a minimum circuit unit; and each straight line between blocks or between a block and a circle denotes a hierarchical relationship. Further, the upper side object of each straight line belongs to a relatively high hierarchy while the lower side object belongs to a comparatively low hierarchy. It is to be noted that each broken line denotes a component added or deleted by logical modification.

Further, in the present embodiment, a sub region called physical block in a mounting region is allocated to a circuit block (divided circuit), which is a group of several leaf cells, by the floor planning apparatus described hereinabove with reference to FIGS. 1 and 2. It is to be noted that one sub circuit corresponds to one physical block.

Upon circuit division, such a circuit diagram as shown in FIG. 3 is displayed on the display unit 24 by the logic circuit division editor 21, and if an operator who refers to the display unit 24 designates a logical hierarchy or a leaf cell which is an element of the circuit diagram and instructs the logic circuit division editor 21 of it, then the circuit of the floor planning object is divided into sub circuits. A result of the division is managed by the circuit construction management section 12 and the divided circuit management section 13E as described hereinabove.

In this instance, by managing the sub circuits while only one sub circuit is mapped with each of all logical hierarchies in advance, a sub circuit to which a logical hierarchy or a leaf cell added is reserved. In particular, it is defined as a rule in default interpretation that an object of the lower side logic hierarchy belongs to a sub circuit to which an object of the higher side logical hierarchy belongs. Consequently, a sub circuit to which an object of the lower side logical hierarchy should belong is reserved.

For example, while an example wherein the circuit shown in FIG. 3 is divided into four sub circuits A, B, C and D is shown in FIG. 4, in the example shown in FIG. 4, if a leaf cell is added to the lower side of the logical hierarchy 3, then the leaf cell is added to the sub circuit C to which the logical hierarchy 3 belongs, that is, to the physical block C. Similarly, a logical hierarchy 6 added to the lower side of the logical hierarchy 4 and leaf cells belonging to the logical hierarchy 6 are added to the sub circuit D to which the logical hierarchy 4 belongs, that is, to the physical block D.

Now, detailed examples of an area calculation expression and an evaluation expression are described.

Where the design object circuit is an LSI, a part which composes a leaf cell may be a basic cell, an area including a wiring line region, a pin, a network, a fan-out or the like.

Thus, in the present embodiment, information of such parts is registered in advance in the part library management section 11, and for each sub circuit, an area number (which corresponds to an area of a wiring line region) A of the sub circuit, a total basic cell number B of the sub circuit, a pin number P of the sub circuit, a network number N of the sub circuit and a fan-out number F of the sub circuit are calculated based on the information of the part library management section 11 by the part number calculation section 32. It is to be noted that all of such values are not calculated, but only those values which are required to calculate the area (those values which are used as variables of an area calculation expression) are calculated.

Then, a physical block area S converted with a basic cell area is calculated using such an area calculation expression (1) or (2) as given below by the area calculation section 33.

For example, where an area calculation expression $$S > 2.0 * B \text{ and } S < 2.2 * B \tag{1}$$

is given by an operator, at a point of time when modification to the total basic area B of a sub circuit is detected, a physical block area S which satisfies the expression (1) is calculated by the area calculation section 33.

On the other hand, where another area calculation expression (2)

$$S=1.0*B+0.1*F \tag{2}$$

is given, a value obtained by adding, to a raw basic cell area B, a 0.1 basic cell area as a wiring line region for each fan-out is calculated as the physical block area S.

It is to be noted here that, while the area calculation expressions which involve the total basic area B and the fan-out number F are given, an area can be calculated otherwise using an area calculation expression which includes a combination of more than one of a total basic area B, an area number A, a pin number P, a net number N and a fan-out number F as variables.

Further, by providing a width (range) to an expression for calculation of a required area S for a physical block to provide a width (range) to the calculation result S as in the area calculation expression (1) above, frequent modification to the shape of a figure by area re-calculation can be prevented.

In the meantime, while a similar expression to an area calculation expression can be designated as an evaluation expression, the evaluation section 37 of the floor planning apparatus of the present embodiment evaluates the shape of a physical block using, for example, an expression (3) given below. In this instance, the evaluation section 37 determines, based on a shape obtained by the theoretical shape calculation section 34 or a shape after modification obtained by the shape modification section 36, an actual dimension MINW of a minimum width of a physical block and a minimum height MINH of the physical block, and discriminates whether or not they satisfy the expression (3)

$$\text{MINW}>8.0 \ \mu\text{m and MINH}>20.0 \ \mu\text{m} \tag{3}$$

to evaluate the physical block. It is to be noted that, while the expression (3) defines comparison with constants, a number of networks between physical blocks with a direction designated or a wiring line distance may be designated as a variable and inserted into an evaluation expression.

Figure 5:
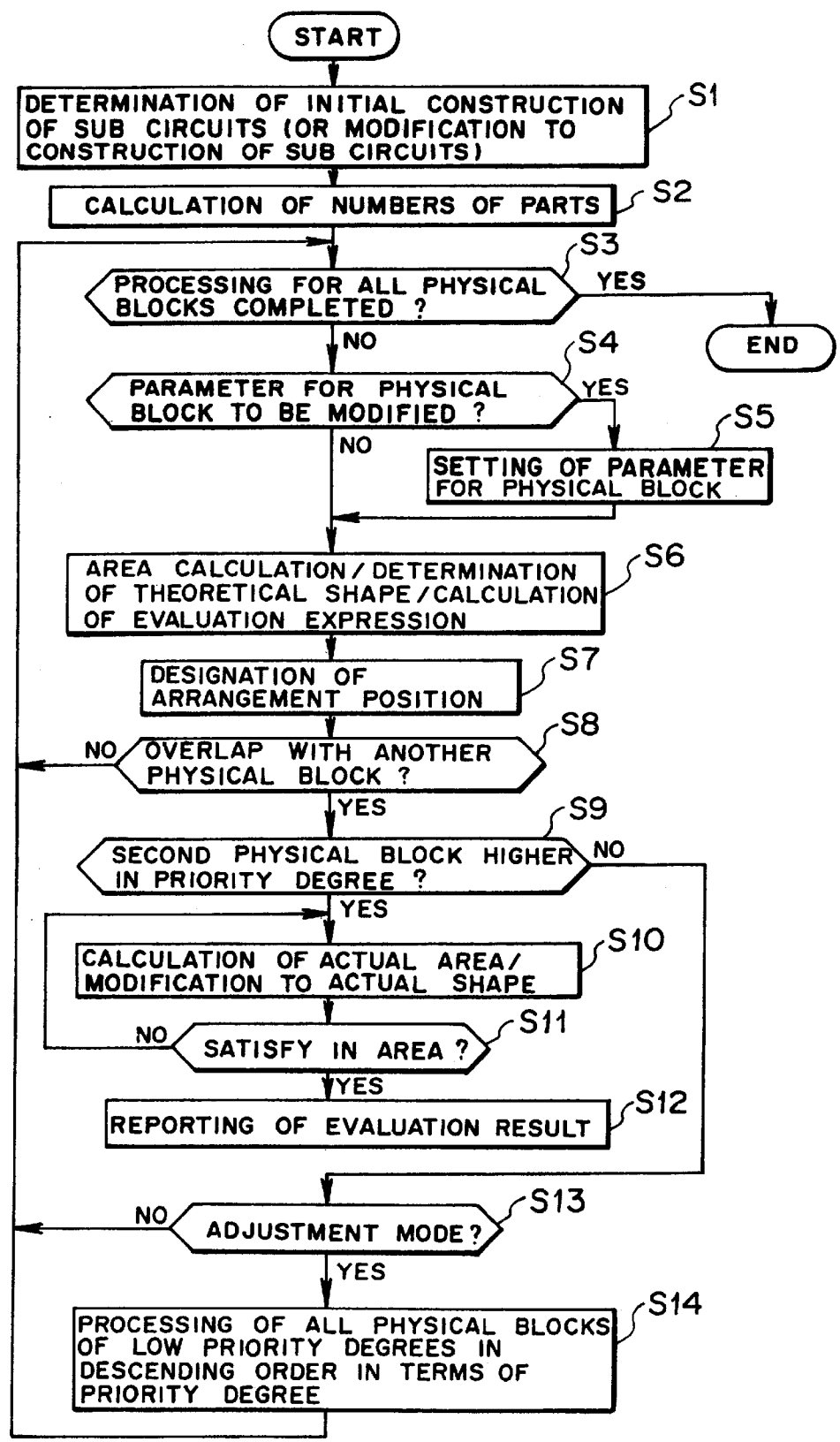
FIG. 5 is a flow chart illustrating a physical block shape determination procedure by the floor planning apparatus of FIG. 1A.

Now, a physical block shape determination procedure by the floor planning apparatus of the present embodiment (operation of the floor planning apparatus of the present embodiment) is described with reference to a flow chart (steps S1 to S14) shown in FIG. 5.

When floor planning is performed, an initial construction of sub circuits or a construction modification of sub circuits is determined by an instruction of an operator (step S1). Particularly, designation data is inputted through the logic circuit division editor 21. At this point of time, such circuit division as described with reference to FIG. 4 has been completed, and each leaf cell which is a minimum circuit unit of an object of mounting belongs to one of the sub circuits, and the sub circuits correspond one by one to physical blocks. Further, the physical block management section 13 has default values common to all of the physical blocks set therein as parameters of area calculation expressions, evaluation values, shapes, priority degrees and so forth.

After an initial construction of sub circuits or a construction modification to sub circuits is determined as described above (step S1), the minimum circuit unit recognition section 31 recognizes, based on information stored in the circuit construction management section 12 and the divided circuit management section 13E, minimum circuit units (leaf cells) which compose the sub circuits, and then the part number calculation section 32 acquires the numbers of parts which compose the minimum circuit units recognized by the minimum circuit unit recognition section 31 from the part library management section 11 and calculates total numbers of different parts of the sub circuits (required ones of the values B, A, P, N and F mentioned hereinabove) (step S2).

Then, processing for all of the physical blocks is started, and it is discriminated in step S3 whether or not processing for all of the physical block is completed. If it is discriminated here that processing for all of the physical blocks is completed (YES route), then the processing comes to an end. However, if a physical block for which processing is not completed remains (NO route), then the control advances to next step S4.

When the operator requests for modification to a parameter of a physical block (YES route from step S4), various parameters (area calculation expression, evaluation expression, shape, priority degree and so forth) of the physical block management section 13 are modified through the keyboard editor 22 (step S5).

Figure 6:
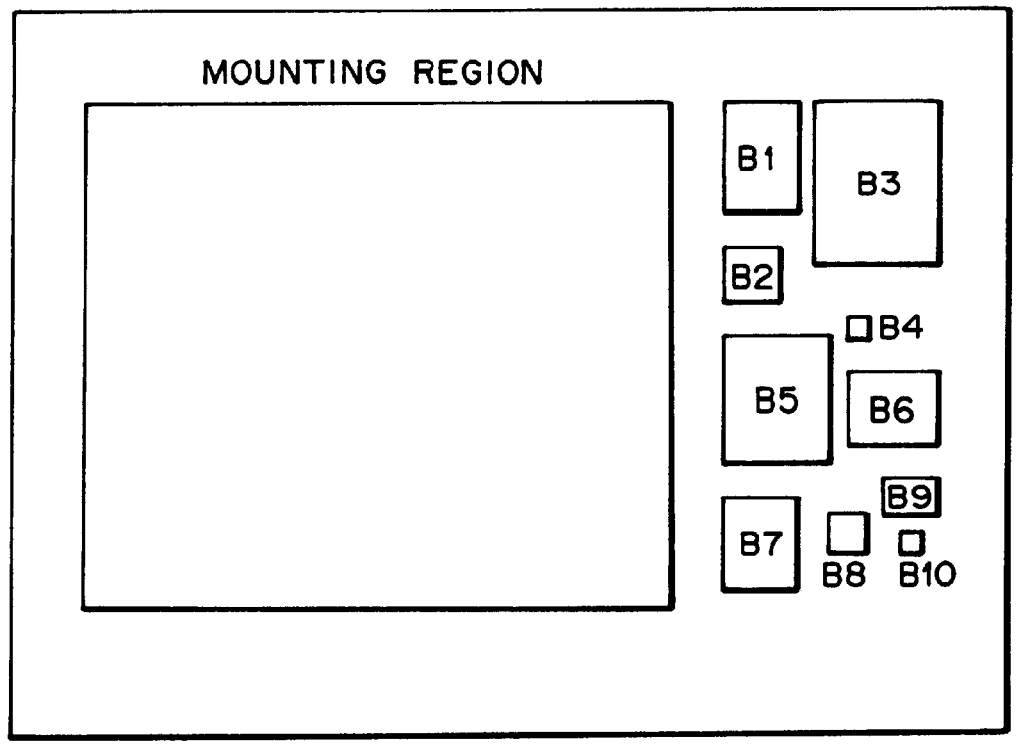
FIG. 6 is a schematic illustration showing an example of a screen on which a mounting region and physical circuits for realizing sub circuits are displayed.

When no modification to a parameter is to be performed (NO route from step S4) or after modification to a parameter is performed in step S5, calculation of the area, the theoretical shape and an evaluation expression of the physical block is performed and the shape and an evaluation result of the physical block are reported to the operator through the display unit 24 (step S6). In an initial state in which no physical block is arranged, for example, such a screen as shown in FIG. 6 is displayed on the display unit 24. In FIG. 6, an example of a screen on which a mounting area and physical blocks B1 to B10 which realize the sub circuits are displayed is shown. In the display of the initial state, the physical blocks B1 to B10 are not arranged as yet, and the shapes of the physical blocks B1 to B10 are displayed in their theoretical shapes (rectangles).

The operation in step S6 is described in more detail. The area calculation section 33 substitutes the total numbers of the different parts calculated by the part number calculation section 32 into an area calculation expression read out from the area calculation expression storage section 13A to calculate and determine the area of each physical block. Thereafter, the theoretical shape calculation section 34 calculates the theoretical shape (rectangle) based on the area of the physical block determined by the area calculation section 33 and shape production parameters set in advance for the physical block. Further, the evaluation section 37 substitutes the area determined by the area calculation section 33 and/or the values of the shape (horizontal or vertical dimensions of the rectangle) calculated by the theoretical shape calculation section 34 into the evaluation expression read out from the evaluation expression storage section 13B to evaluate the area and/or the shape of each physical block. Then, the display control section 38 controls the display unit 24 to display the theoretical shapes of the physical blocks obtained by the theoretical shape calculation section 34 and/or the evaluation results by the evaluation section 37.

The operator who refers to the screen of the display unit 24 uses the pointing device 25 to designate, on the screen of the display unit 24, a physical block of an object of arrangement and a position in the mounting region at which the physical block is desired to be arranged (refer to, for example, the position P1 of FIG. 7A) (step S7). In response to the designation, processing to arrange the designated physical block at the designated position is performed by the arrangement processing section 35, and a result of the arrangement is stored into the mounting region management section 14.

Then, it is discriminated whether or not the operator has designated the arrangement position so that the designated physical block may not overlap with any other physical block arranged already, that is, whether or not the designated physical block overlaps with any other physical block arranged already (step S8). If the designated physical block does not overlap (NO route), then the control returns to step S3. On the other hand, if the designated physical block overlaps with another or second physical block arranged already (YES route), then it is discriminated whether or not the priority degree of the second physical block is higher than that of the designated physical block (step S9). The discrimination in step S9 is performed, in the present embodiment, by the shape modification section 36.

If it is discriminated in step S9 that the priority degree of the second physical block is higher (YES route), then processing of a loop of steps S10 and S11 is performed in the inside of the floor planning apparatus (by the shape modification section 36), and at a point of time when the determined area by the area calculation section 33 becomes satisfied by the area (YES route from step S11), evaluation based on an evaluation expression is performed by the evaluation section 37 and the shape after the modification to the physical block and a result of the evaluation are displayed on the display unit 24 by the display control section 38 to report them to the operator (step S12). If the operator is not satisfied with the result of the evaluation, then the control returns to step S4 or step S7, but if the operator is satisfied, then the control returns to step S3.

Here, the processing in steps S10 and S11 (that is, operation of the shape modification section 36) is described in more detail with reference to FIGS. 7A and 7B. It is to be noted that FIGS. 7A and 7B illustrate an automatic shape adjustment procedure (shape modification process) of a physical block by the floor planning apparatus of the present embodiment.

The shape modification section 36 automatically modifies the shape of the physical block, which has a lower priority degree, arranged by the current operation so that the area of the physical block may become equal to the determined area by the area calculation section 33 and the physical block may not overlap with the physical block of the higher priority degree.

Figure 7A:
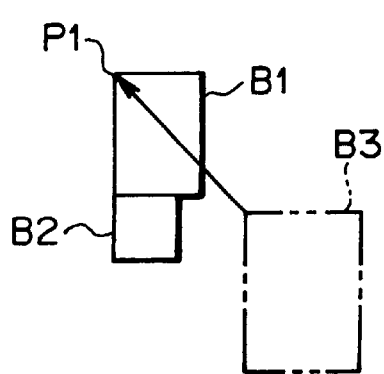
FIGS. 7A and 7B are diagrammatic views illustrating an automatic shape adjustment procedure (shape modification process) of a physical block by the floor planning apparatus of FIG. 1A.
Figure 7B:
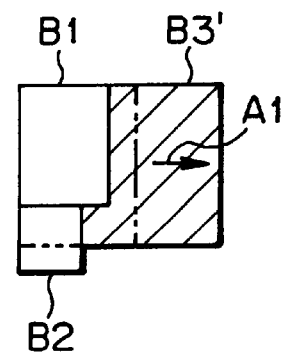

For example, where physical blocks B1 and B2 are arranged already in such a manner as shown in FIG. 7A, if it is tried to arrange a further physical block B3 of a theoretical shape such that the left upper corner of the physical block B3 may be positioned at the designation position P1 (the left upper corner of the physical block B1), then the physical block B3 overlaps with the physical blocks B1 and B2 arranged already.

In this instance, if the priority degree of the physical block B3 is lower than those of the physical blocks B1 and B2, then by the function of the shape modification section 36 of the floor planning apparatus of the present embodiment, portions (overlapping regions) overlapping with the physical blocks B1 and B2 are first deleted from the physical block B3. Since the deletion of the overlapping regions decreases the area of the physical block B3 by an area equal to those of the overlapping regions, in the present embodiment, the shape of the physical block B3 is modified such that the physical block B3 is expanded in a direction indicated by an arrow mark A1 in FIG. 7B to secure an area necessary for the physical block B3 (the determined area by the area calculation section 33). As a result, the physical block B3 is modified to a physical block B3' which has a polygonal shape different from the theoretical shape (rectangle).

In this manner, if physical blocks are arranged in an overlapping relationship with each other, the shape modification section 36 restricts the overlapping region between them so as to be occupied by only one of the physical blocks in accordance with the priority degrees of them, subtracts the area of the overlapping region from the physical block which is determined not to occupy the overlapping region and automatically modifies the shape of the physical block so that the physical block may have a designated area.

It is to be noted that, while FIG. 7B illustrates a case wherein the operator designates such shape modification that the physical block B3 is expanded in the direction indicated by the arrow mark A while the length of the physical block B3 in the vertical direction in FIG. 7B is fixed, naturally the present invention is not limited to the specific case, and a physical block may be expanded only in the vertical direction while the length of the physical block in the horizontal direction is fixed or may be expanded in both of the horizontal direction and the vertical direction.

On the other hand, if it is discriminated in step S9 that the second physical block has a lower priority degree (NO route), then it is discriminated whether or not the mode set by the mode setting section 39 is the adjustment mode or the inhibition mode (step S13). If the adjustment mode, that is, the mode in which the second or overlapped physical block which is influenced by the physical block arranged by the processing in step S7 should be adjusted immediately, is set (YES), then the shape modification section 36 performs shape adjustment of the physical block having the lower priority degree (step S14). The shape adjustment is executed by processing of a loop similar to that of steps S10 and S11 described hereinabove. Further, similarly as in step S12 described above, also evaluation of a result of the shape adjustment is performed by the evaluation section 37, and a result of the evaluation is displayed on the display unit 24.

It is to be noted that, in the present embodiment, since different priority degrees are set for different physical blocks so that any two physical blocks may not have an equal priority degree, that is, the priority relationship may not form a loop, upon shape adjustment of physical blocks, processing should be proceeded in a descending order in terms of the priority degree.

On the other hand, if the inhibition mode is set by the mode setting section 39 (NO route from step S13), then the control returns to step S3. Accordingly, while the inhibition mode is set, execution of useless calculation upon shape determination during editing is inhibited.

After the position and the shape of one physical block are determined, the control returns to step S3. Then, if it is determined in step S3 that there remains no physical block whose shape should be determined (YES route), the processing by the floor planning apparatus of the present embodiment comes to an end.

Further, in the floor planning apparatus of the present embodiment, also when a logical modification or a construction modification to a sub circuit occurs or a request for change of the arrangement position of a physical block is produced by the operator in a condition wherein all physical blocks are arranged already (refer to step S1), the shape of a physical block is re-adjusted in accordance with a procedure similar to that of the flow chart described above with reference to FIG. 5. In this instance, the area calculation section 33 automatically performs re-calculation using the area calculation expressions (expressions used for calculation of the areas for the individual physical blocks) stored in the area calculation expression storage section 13A to re-calculate the area.

Figure 8:
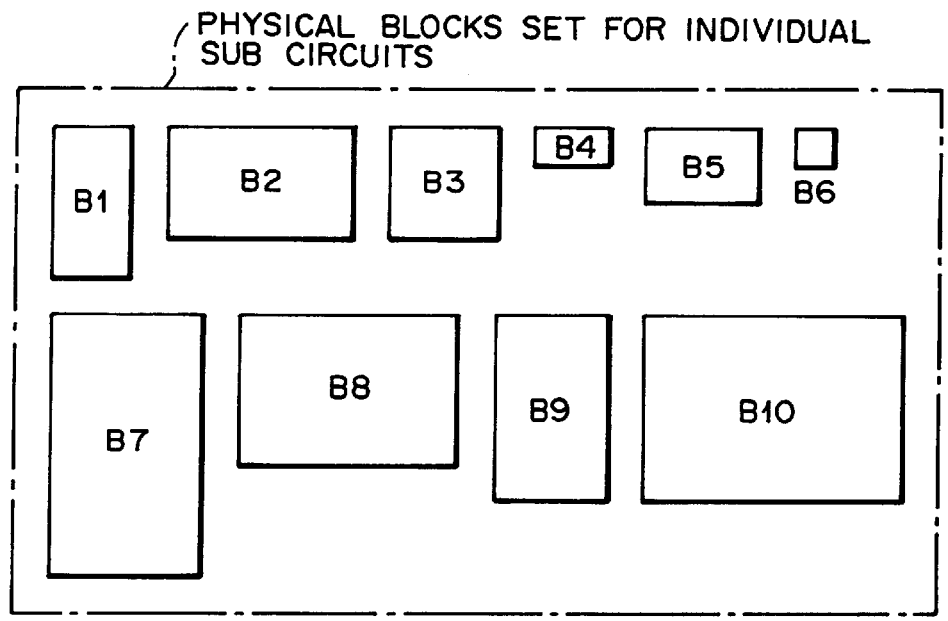
FIG. 8 is a schematic view showing an example of physical blocks set for individual sub circuits.
Figure 10:
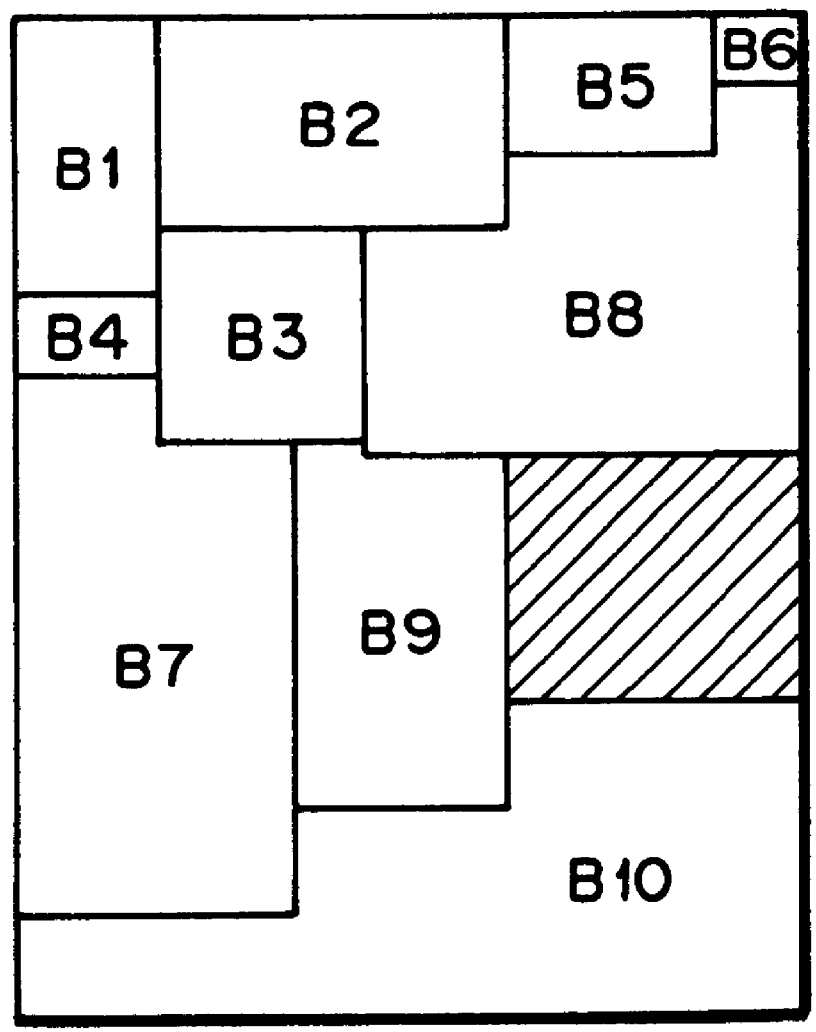
FIG. 10 is a schematic view showing an example wherein the physical blocks shown in FIG. 8 are arranged in the mounting region using the floor planning apparatus of FIG. 1A.

Further, an example wherein the physical blocks B1 to B10 of various shapes/areas shown in FIG. 8 are arranged in the mounting region using the floor planning apparatus of the present embodiment described hereinabove is shown in FIG. 10. It is to be noted that the physical blocks B1 to B10 shown in FIG. 8 and the physical blocks B1 to B10 shown in FIGS. 6, 7A and 7B are produced in different conditions and have different shapes from each other.

Figure 9:
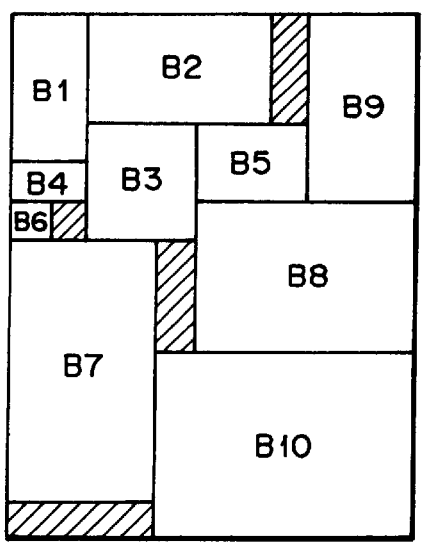
FIG. 9 is a schematic view showing an example wherein the physical blocks shown in FIG. 8 are arranged in a mounting region using a common floor planning technique.

In the mounting region shown in FIG. 10, while the physical blocks B1 to B4 are arranged at same positions as those in the example shown in FIG. 9, the physical blocks B5 and B6 are arranged at different positions from those in the example shown in FIG. 9. Here, the physical block B5 is arranged merely designating a position adjacent the physical block B2 and similarly the physical block B6 is arranged merely designating a position adjacent the physical block B5, and for the arrangement of them, the characteristic function of the floor planning apparatus of the present embodiment is not used.

A result of arrangement of the physical blocks B7 to B10 using the characteristic function of the floor planning apparatus of the present embodiment after the physical blocks B1 to B6 are arranged in this manner is shown in FIG. 10.

Referring to FIG. 10, for the physical block B7, an adjacent position just below the physical block B4 is designated, and the physical block B7 is arranged while it is expanded downwardly by an area equal to the area over which the physical block B7 overlaps with the physical block B3. Meanwhile, for the physical block B8, a position at which it overlaps with the physical blocks B2, B5 and B6 is designated, and the physical block B8 is arranged such that it is expanded downwardly by an area equal to the area of the portions which overlap with the physical blocks B2, B5 and B6. Similarly, for the physical block B9, a position adjacent the physical block B7 and just downwardly adjacent the physical block B3 is designated, and the physical block B9 is arranged such that it is expanded downwardly by an area equal to the area of the portion which overlaps with the physical block B8. Furthermore, for the physical block B10, a most downward position in the mounting region adjacent the physical blocks B7 and B9 is designated, and the physical block B10 is arranged such that it is expanded rightwardly by an area equal to that of portions which overlap with the physical blocks B7 and B9.

As a result, the physical blocks B1 to B10 are arranged very efficiency in a high density in the mounting region as seen in FIG. 10. Then, a non-used area (refer to a slanting line region or regions) can be formed not in a condition dispersed at a plurality of positions as in FIG. 9, but in the form of a single large region, and a new physical block or blocks can be arranged in the non-used area. The size or shape of the new physical block or blocks are not subject to such limitation as that by a common floor planning apparatus, and a physical block or blocks of various types can be arranged and circuit parts can be arranged in a high density upon mounting designing.

In this manner, with the floor planning apparatus according to the embodiment of the present invention, for example, where the design object circuit is an LSI, the areas of physical blocks can be determined automatically taking not only basic cells, but also areas including wiring line regions, pins, networks and fan-outs into consideration. In short, physical blocks having areas corresponding sufficiently to actual sub circuits can be produced automatically, and upon mounting designing, circuit parts can be arranged in a high density without giving rise to a problem in regard to the accuracy.

Further, if circuit division is performed and expressions for calculation of areas and parameters for production of shapes are designated for sub circuits, then since the areas and theoretical shapes (rectangles) of the physical blocks are determined automatically for the individual sub circuits and displayed on the display unit 24, the operator can refer to the display unit 24 and confirm the physical blocks having the areas and the theoretical shapes determined automatically.

When physical blocks whose areas and theoretical shapes are determined are arranged, since overlapping arrangement of a physical block with another physical block is allowed by setting a priority degree for each physical block in advance, while the shape of each block is handled as a rectangle at all in operation, a shape (polygon) other than a rectangle can be provided as an actual shape to the physical block. In this instance, the shape of the physical block of the arrangement object is automatically modified based on the priority degrees of the physical blocks, information of the overlapped physical block or blocks and the designated area of the physical block of the arrangement object. Accordingly, physical blocks are arranged very efficiently in a mounting region, and also the problem of signal delays can be eliminated with certainty while satisfying high density arrangement of circuits.

Further, when logical modification in circuit designing occurs, whether or not modification to the floor plan is required is discriminated by executing calculation processing using an area calculation expression and an evaluation expression registered by the operator in advance, and based on a result of the discrimination, modification to the area/shape of a physical block can be performed automatically or can be reported to the operator.

Further, in the present embodiment, by limiting the theoretical shapes of physical blocks only to rectangles, calculation and determination of theoretical shapes of physical blocks by the theoretical shape calculation section 34 can be performed very readily, and the time required for calculation can be reduced remarkably.

Furthermore, since the areas and the shapes of the physical blocks determined are automatically evaluated using evaluation expressions and a result of the valuation is displayed on the display unit 24, the operator who refers to the display unit 24 can confirm the evaluation result of the areas and the shapes of the physical blocks and can determine very readily whether or not processing (modification to the division condition or the like) conforming to the result of the evaluation should be performed.

It is to be noted that the present invention is not limited to the embodiment described above and can be worked in various forms without departing from the spirit or scope of the present invention.

For example, while, in the embodiment described above, description is given of a case wherein the design object circuit is an LSI (Large Scale Integration), the present invention is not limited to the specific case, and the present invention can be applied similarly also where the design object circuit is a circuit of a different type such as a PCB (Printed Circuit Board). Also in this instance, similar effects to those of the embodiment described above can be achieved.

What is claimed is:

1. A floor planning apparatus which determines, in order to mount a design object circuit, for each of sub circuits obtained by dividing the design object circuit, a physical block having an area necessary to mount the sub circuit in a mounting region and arranges the physical blocks in the mounting region, comprising:

a circuit unit recognition section recognizing circuit units which compose each of the sub circuits;

a part information storage section storing, for each of the circuit units, numbers of parts of different part types which compose the circuit unit;

a part number calculation section acquiring, for each of the different part types, the numbers of the parts composing the circuit units recognized by said circuit unit recognition section from said part information storage section and calculating, for each of the different part types, total numbers of the parts in each of the sub circuits;

an area calculation section calculating and determining an area of the physical block based on the total numbers of the parts calculated for each of the different part types by said part number calculation section;

a theoretical shape calculation section calculating a theoretical shape of the physical block based on the area of the physical block determined by said area calculation section and a shape production parameter set in advance for the physical block;

a display control section causing a display section to display the physical block having the theoretical shape obtained by said theoretical shape calculation section;

an arrangement section arranging the physical block having the theoretical shape obtained by said theoretical shape calculation section at a designated position in the mounting region; and a shape modification section deleting, when the physical block arranged by said arrangement section overlaps with another one of the physical blocks arranged already, an overlapping portion from one of the arranged physical block and the already arranged physical block and modifying the shape of the one physical block whose overlapping portion is deleted in such a manner that the one physical block has an area equal to the area determined by said area calculation section and does not overlap with the other one of two physical blocks from which the overlapping portion is not deleted.

2. A floor planning apparatus as claimed in claim 1, further comprising a priority order storage section storing a priority order set in advance for the individual physical blocks, and wherein said shape modification section determines one of the physical blocks from which the overlapping portion is to be deleted to modify the shape of the physical block based on the priority order stored in said priority order storage section.

3. A floor planning apparatus as claimed in claim 2, further comprising a mode setting section setting a mode in which modification to the shape of any already arranged physical block by said shape modification section is inhibited.

4. A floor planning apparatus as claimed in claim 3, wherein the theoretical shapes of the physical blocks calculated by said shape modification section are limited to rectangles.

5. A floor planning apparatus as claimed in claim 2, wherein the theoretical shapes of the physical blocks calculated by said shape modification section are limited to rectangles.

6. A floor planning apparatus as claimed in claim 1, further comprising a mode setting section setting a mode in which modification to the shape of any already arranged physical block by said shape modification section is inhibited.

7. A floor planning apparatus as claimed in claim 6, wherein the theoretical shapes of the physical blocks calculated by said shape modification section are limited to rectangles.

8. A floor planning apparatus as claimed in claim 1, wherein the theoretical shapes of the physical blocks calculated by said shape modification section are limited to rectangles.

9. A floor planning apparatus as claimed in claim 1, further comprising an area calculation expression storage section storing an area calculation expression to be used for calculation of the areas of the physical blocks, and wherein said area calculation section re-calculates, upon division modification or logical modification of the design object circuit, the areas of the physical blocks using the area calculation expression stored in said area calculation expression storage section.

10. A floor planning apparatus as claimed in claim 1, further comprising:

an evaluation expression storage section for storing an evaluation expression to be used for evaluation of the areas/shapes of the physical blocks;

an evaluation section for evaluating the areas/shapes of the physical blocks based on the evaluation expression stored in said evaluation expression storage section; and a display control section for causing said display section to display a result of the evaluation by said evaluation section.

11. A circuit design apparatus, comprising:

an arrangement section arranging a physical block having a calculated theoretical shape at a designated position in a mounting region; and a shape modification section deleting, when the physical block arranged by said arrangement section overlaps with another one of the physical blocks arranged already, an overlapping portion from one of a newly arranged physical block and the already arranged physical block and modifying the shape of the one physical block whose overlapping portion is deleted in such a manner that the one physical block has an area equal to an area based on total numbers of parts calculated for each of different part types and does not overlap with the other one of two physical blocks from which the overlapping portion is not deleted.

12. A floor planning method for determining, in order to mount a design object circuit, for each of sub circuits obtained by dividing the design object circuit, a physical block having an area necessary to mount the sub circuit in a mounting region and arranging the physical blocks in the mounting region, comprising:

recognizing, for each of the sub circuits, circuit units which compose the sub circuit;

acquiring, for each of the circuit units recognized, numbers of parts of different part types which compose the circuit unit and calculating, for each of the different part types, total numbers of the parts in each of the sub circuits;

calculating and determining an area of the physical block based on the total numbers of the parts calculated for each of the different part types;

calculating a theoretical shape of the physical block based on the area of the physical block and a shape production parameter set in advance for the physical block;

causing a display section to display the physical block having the calculated theoretical shape; and deleting, when the physical block having the calculated theoretical shape is arranged at a designated position in the mounting region, if the physical block overlaps with another one of the physical blocks arranged already, an overlapping portion from one of a newly arranged physical block and the already arranged physical block and modifying the shape of the one physical block whose overlapping portion is deleted in such a manner that the one physical block has an area equal to a determined area and does not overlap with the other one of two physical blocks from which the overlapping portion is not deleted.

13. A floor planning method as claimed in claim 12, wherein one of the physical blocks from which the overlapping portion is to be deleted to modify the shape of the physical block is determined based on a priority order set in advance for the individual physical blocks.

14. A circuit design method, comprising:

arranging a physical block having a calculated theoretical shape at a designated position in a mounting region; and deleting, when the physical block arranged by said arrangement section overlaps with another one of the physical blocks arranged already, an overlapping portion from one of a newly arranged physical block and the already arranged physical block and modifying the shape of the one physical block whose overlapping portion is deleted in such a manner that the one physical block has an area equal to an area based on total numbers of parts calculated for each of different part types and does not overlap with the other one of two physical blocks from which the overlapping portion is not deleted.

15. A computer-readable recording medium having a floor planning program recorded thereon for causing, in order to mount a design object circuit, a computer to determine, for each of sub circuits obtained by dividing the design object circuit, a physical block having an area necessary to mount the sub circuit in a mounting region and arrange the physical blocks in the mounting region, said floor planning program causing said computer to operate as:

a circuit unit recognition section recognizing circuit units which compose each of the sub circuits;

a part number calculation section acquiring, for each of the different part types, numbers of parts composing the circuit units recognized by said circuit unit recognition section and calculating, for each of the different part types, total numbers of the parts in each of the sub circuits;

an area calculation section calculating and determining an area of the physical block based on the total numbers of the parts calculated for each of the different part types by said part number calculation section;

a theoretical shape calculation section calculating a theoretical shape of the physical block based on the area of the physical block determined by said area calculation section and a shape production parameter set in advance for the physical block;

a display control section causing a display section to display the physical block having the theoretical shape obtained by said theoretical shape calculation section;

an arrangement section arranging the physical block having the theoretical shape obtained by said theoretical shape calculation section at a designated position in the mounting region; and a shape modification section deleting, when the physical block arranged by said arrangement section overlaps with another one of the physical blocks arranged already, an overlapping portion from one of a newly arranged physical block and the already arranged physical block and modifying the shape of the one physical block whose overlapping portion is deleted in such a manner that the one physical block has an area equal to the area determined by said area calculation section and does not overlap with the other one of two physical blocks from which the overlapping portion is not deleted.

16. A computer-readable recording medium having a floor planning program recorded thereon as claimed in claim 15, wherein, when said floor planning program causes said computer to function as said shape modifications sections, said floor planning programs causes said computer to determined one of the physical block from which the overlapping portion is to be deleted to modify the shaped of the physical block based on a priority order set in advance for the individual physical blocks.

17. A computer readable storage medium, storing a program containing a circuit design method, the program instructing a computer to perform:

arranging a physical block having a calculated theoretical shape at a designated position in a mounting region; and deleting, when the physical block arranged by said arrangement section overlaps with another one of the physical blocks arranged already, an overlapping portion from one of a newly arranged physical block and the already arranged physical block and modifying the shape of the one physical block whose overlapping portion is deleted in such a manner that the one physical block has an area equal to an area based on total numbers of parts calculated for each of different part types and does not overlap with the other one of two physical blocks from which the overlapping portion is not deleted.

* * * * *